(12) United States Patent
Crouch et al.

(10) Patent No.: US 10,171,006 B2
(45) Date of Patent: *Jan. 1, 2019

(54) POWER POLE INVERTER

(71) Applicant: Eaton Intelligent Power Limited, Dublin (IE)

(72) Inventors: Jonathan Crouch, Waynesville, NC (US); Wesley Byron Johnson, Fletcher, NC (US); Irving Gibbs, Mills River, NC (US); Ron Schueneman, Arden, NC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/480,704

(22) Filed: Apr. 6, 2017

(65) Prior Publication Data

US 2017/0214332 A1    Jul. 27, 2017

Related U.S. Application Data

(63) Continuation of application No. 14/798,503, filed on Jul. 14, 2015, now Pat. No. 9,648,792, which is a continuation of application No. 13/834,332, filed on Mar. 15, 2013, now Pat. No. 9,148,985.

(51) Int. Cl.

| | |
|---|---|
| *H02M 7/00* | (2006.01) |
| *H05K 7/20* | (2006.01) |
| *H05K 5/06* | (2006.01) |
| *H02M 1/08* | (2006.01) |
| *H02M 7/537* | (2006.01) |

(52) U.S. Cl.
CPC ............. *H02M 7/003* (2013.01); *H02M 1/08* (2013.01); *H02M 7/537* (2013.01); *H05K 5/069* (2013.01); *H05K 7/2039* (2013.01); *H05K 7/2089* (2013.01); *H05K 7/20927* (2013.01); *H05K 7/20936* (2013.01)

(58) Field of Classification Search
CPC .... H05K 7/2089; H05K 7/2039; H05K 5/069; H02M 1/08; H02M 7/537
See application file for complete search history.

(56) References Cited

U.S. PATENT DOCUMENTS

| | | | |
|---|---|---|---|
| 4,243,894 A | 1/1981 | Kuntner et al. | |
| 5,337,214 A | 8/1994 | Lindsey et al. | |
| 5,576,943 A | 11/1996 | Keir | |
| 5,617,307 A | 4/1997 | Guigueno | |
| 6,087,800 A | 7/2000 | Becker et al. | |
| 6,154,369 A * | 11/2000 | Martinez, Jr. ........... | H01L 23/24 174/252 |
| 6,297,607 B1 | 10/2001 | Becker | |
| 6,351,113 B1 | 2/2002 | Becker et al. | |
| 6,822,866 B2 * | 11/2004 | Fearing ................. | H02M 7/003 165/286 |
| 9,019,731 B2 | 4/2015 | Tong et al. | |
| 9,148,985 B2 * | 9/2015 | Crouch ................ | H02M 7/003 |

(Continued)

*Primary Examiner* — Zachary Pape
(74) *Attorney, Agent, or Firm* — Eckert Seamans

(57) ABSTRACT

An arm assembly is provided. The arm assembly includes a plurality of electrical components and a number of electrical buses. Each electrical component is coupled to, and in electrical communication with, one electrical bus. A sealing compound is then applied to each electrical bus and to a limited number of the electrical components.

15 Claims, 5 Drawing Sheets

(56) References Cited

U.S. PATENT DOCUMENTS

| | | | |
|---|---|---|---|
| 9,648,792 B2 * | 5/2017 | Crouch | H05K 7/20936 |
| 2003/0133257 A1 | 7/2003 | Beihoff et al. | |
| 2008/0111151 A1 * | 5/2008 | Teraki | H01L 23/473 |
| | | | 257/177 |
| 2009/0290398 A1 * | 11/2009 | Kanie | H02M 7/003 |
| | | | 363/132 |
| 2012/0106086 A1 * | 5/2012 | Schloerke | H01L 25/072 |
| | | | 361/715 |

\* cited by examiner

POWER POLE INVERTER

CROSS REFERENCE TO RELATED APPLICATION

This application is a continuation application of and claims priority to U.S. patent application Ser. No. 14/798,503, filed Jul. 14, 2015, which application is a continuation application and claims priority to Ser. No. 13/834,332, filed Mar. 15, 2013 entitled, POWER POLE INVERTER.

BACKGROUND OF THE INVENTION

Field of the Invention

The disclosed and claimed concept relates to power pole inverters and, more specifically, to an arm assembly wherein insulation encloses a limited number of inverter components.

Background Information

Adjustable or variable speed AC drives are commonly used to drive AC induction motors allowing for its speed control. AC drives generally provide the advantage of energy savings because they control the characteristics of its output voltage and current, and thus controlling the motor speed (of the motor they are driving) by the user, optimizing the motor power usage as well as the process it is driving. AC drives operate by taking either incoming AC or DC power, having a fixed frequency and voltage, and converting it to AC power having a voltage or current with variable amplitude and frequency. This allows for the control of the motor speed and power, a requirement in many applications.

An AC drive includes a plurality of inverters and a converter which are electrically coupled through electrical buses and physically coupled through their respective modular bases. The inverters may share a common cooling system connected to the respective heat sinks of each component. That is, an AC drive is made up of a plurality of inverter modules, which are connected to a converter module to create the AC drive, wherein each of the above components is packaged in a relatively small unit having a cooling apparatus. Each of the inverters is made of a modular base, a heat sink or exchanger connected to the base having a plurality of power semiconductor switches, a power supply and a gate driver, thermally coupled thereto, a plurality of capacitors, a plurality of electrical buses connecting the power semiconductor switches to the capacitors, and an insulative medium which encases or covers some or all of the electrically live components, such as the electrical buses. It is further noted that the conductors wrapped around the heat sink. That is, the conductors were U-shaped.

The inverters are, generally, assembled as follows. The semiconductor switches, power supply, gate driver, and other electrical devices, hereinafter "electrical components," are coupled to the heat sink or base element. The electrical components are coupled to a bus, or a number of electrical buses. The heat sink, number of electrical buses, and electrical components are then disposed in an open ended housing assembly. The housing assembly may abut the heat exchange assembly heat exchanger. Thus, the housing assembly is open on one end and otherwise encloses the heat sink and electrical components. The housing assembly is then filled with an insulative potting compound such as, but not limited to, an RTV silicone based compound, and the potting compound is cured. Thus, the heat sink, number of electrical buses, and electrical components are encased in the potting compound. Alternatively, a minor portion of a component could be exposed. Thus, all, or substantially all, of the components were enclosed. Further, in other embodiments, multiple inverter assemblies were disposed in a single enclosed space that was filled with potting compound.

While this configuration protects the heat sink and electrical components, the potting compound makes repair or replacement of an individual electrical component difficult. Often, the inverter(s) must be sent to the manufacturer as repair/replacement of components cannot be performed on-site.

SUMMARY OF THE INVENTION

The disclosed and claimed concept provides an arm assembly wherein the insulative material, hereinafter a "sealing compound," is applied to the electrical bus and to a limited number of electrical components. That is, the arm assembly includes a heat exchanger assembly, a plurality of electrical components thermally coupled to the heat exchanger assembly, and a number of electrical buses. Each electrical component is coupled to, and in electrical communication with, one electrical bus. A sealing compound is then applied to each electrical bus and to a limited number of the electrical components. Thus, a limited number of electrical components are substantially sealed from an atmosphere. The components that are not encased in the sealing compound may be repaired or replaced on site.

The arm assembly may be one of a number of arm assemblies that are part of a power pole inverter. The power pole inverter includes a support assembly, a number of capacitor sets, each capacitor set coupled to the support assembly, a number of inverter assemblies. Each arm assembly is coupled to, and in electrical communication with, one capacitor set. As before, each arm assembly includes a heat exchanger assembly, a plurality of electrical components thermally coupled to the heat exchanger assembly, and a number of electrical buses. Each electrical component is coupled to, and in electrical communication with, one electrical bus. A sealing compound is then applied to each electrical bus and to a limited number of the electrical components. Thus, a limited number of electrical components are substantially sealed from an atmosphere. The components that are not encased in the sealing compound may be repaired or replaced on site.

BRIEF DESCRIPTION OF THE DRAWINGS

A full understanding of the disclosed and claimed concept can be gained from the following description of the preferred embodiments when read in conjunction with the accompanying drawings in which:

DESCRIPTION OF THE PREFERRED EMBODIMENTS

Figure 1:
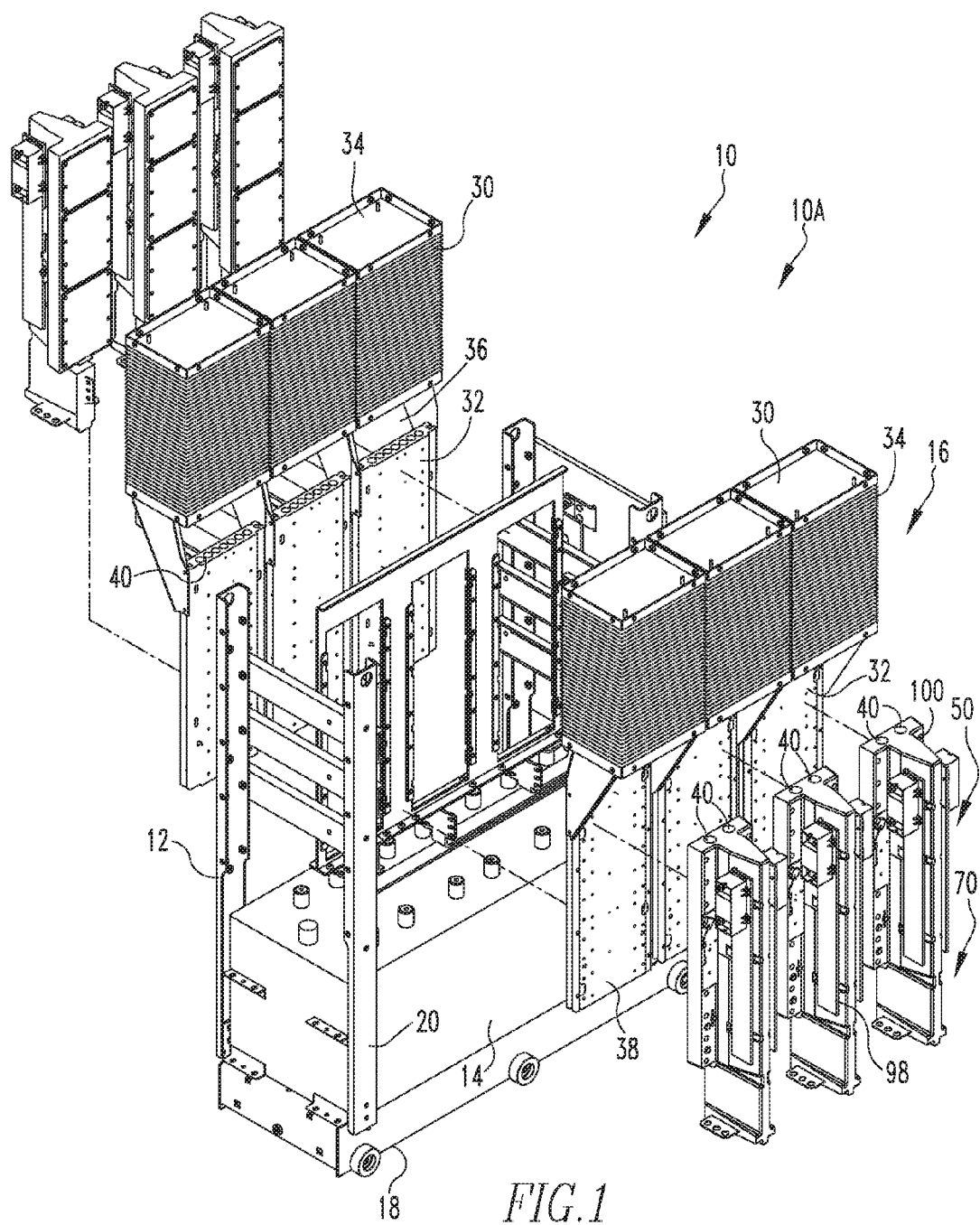
FIG. 1 is an isometric exploded view of a power pole inverter.

As used herein, the singular form of "a," "an," and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the statement that two or more parts or components "engage" one another shall mean that the parts exert a force against one another either directly or through one or more intermediate parts or components.

As used herein, the word "unitary" means a component is created as a single piece or unit. That is, a component that includes pieces that are created separately and then coupled together as a unit is not a "unitary" component or body.

As used herein, the term "number" shall mean one or an integer greater than one (i.e., a plurality).

As used herein, a "coupling assembly" includes two or more couplings or coupling components. The components of a coupling or coupling assembly are generally not part of the same element or other component. As such, the components of a "coupling assembly" may not be described at the same time in the following description. Further, a "removable coupling assembly" is a coupling assembly wherein the components are easily separated, such as, but not limited to a nut and bolt.

As used herein, a "coupling" is one element of a coupling assembly. That is, a coupling assembly includes at least two components, or coupling components, that are structured to be coupled together. It is understood that the elements of a coupling assembly are compatible with each other. For example, in a coupling assembly, if one coupling element is a snap socket, the other coupling element is a snap plug.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are said to fit "snugly" together or "snuggly correspond." In that situation, the difference between the size of the components is even smaller whereby the amount of friction increases. If the element defining the opening and/or the component inserted into the opening are made from a deformable or compressible material, the opening may even be slightly smaller than the component being inserted into the opening. This definition is further modified if the two components are said to "substantially correspond." "Substantially correspond" means that the size of the opening is very close to the size of the element inserted therein. That is, not so close as to cause substantial friction, as with a snug fit, but with more contact and friction than a "corresponding fit," i.e. a "slightly larger" fit.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As shown in FIG. 1, a power pole inverter 10 includes a support assembly 12, a number of capacitors 14, and a number of arm assemblies 16. As shown in an exemplary embodiment, the support assembly 12 is a movable trolley 18 that includes a frame assembly 20. Each capacitor 14 includes a number of capacitors (not shown). Each capacitor 14 is coupled to the support assembly 12. Each arm assembly 16 is coupled to, and in electrical communication with, one capacitor 14. As shown, each arm assembly 16 is coupled to, but not in electrical communication with, the frame assembly 20. As discussed below, an "arm assembly 16" may be a half phase arm assembly or a full phase arm assembly; the term "arm assembly" refers to either.

Figure 2:
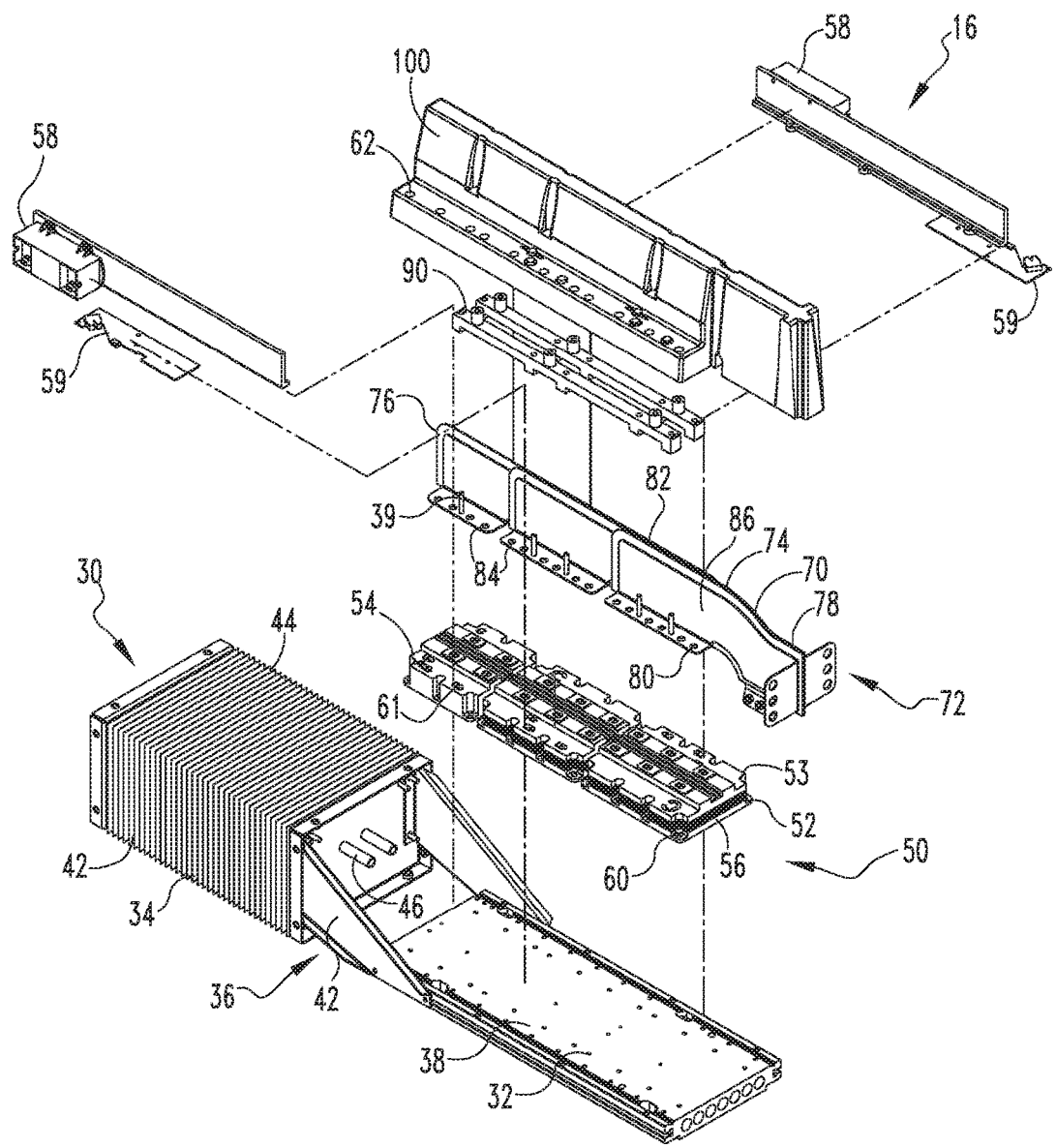
FIG. 2 is an isometric exploded view of an arm assembly.

Each arm assembly 16 includes a heat exchanger assembly 30, a plurality of electrical components 50, a number of electrical buses 70, and a sealing compound 100. The arm assemblies 16 are substantially similar and only one will be described. As shown in FIG. 2, heat exchanger assembly 30 includes a heat sink 32, a heat exchanger 34, and a number of fluid conduits 36. Heat sink 32 is, in an exemplary embodiment, a rectangular planar member 38 having a height, a width and a thickness. Heat sink planar member 38 includes a number of fluid passages 40 (FIG. 1). As shown in an exemplary embodiment, the heat sink fluid passages 40 are generally straight longitudinal passages that may be coupled to, and in fluid communication with, each other.

Heat exchanger 34 is, in the exemplary embodiment, spaced from and disposed longitudinally above heat sink 32. Heat exchanger 34 is structured to dissipate heat and, in an exemplary embodiment, includes a condenser block 42 and a plurality of fins 44. As shown, condenser block 42 is a generally rectangular block that includes a number of internal passages (not shown). It is understood that the configuration of the heat exchanger condenser block 42 is not limited to this configuration, and may be modified in any shape or fashion so as to allow the optimal efficiency of the transfer of heat to the cooling medium. For example, condenser block 42 may be a number of tubular members (not shown) disposed in a block-like configuration and having a plurality of fins 44 coupled thereto. Fins 44 provide an additional thermal surface to increase the efficiency of the heat exchanger assembly 30.

Fluid conduits 36 are coupled to, and in fluid communication with, both heat sink fluid passages 40 and condenser block passages. In this configuration, a fluid within heat sink fluid passages 40 can be transferred to condenser block passages wherein the fluid is cooled. In an exemplary embodiment, fluid conduits 36 and the fins 44 are made from a thermally conductive material, such as, but not limited to, aluminum, copper, etc. Thus, each heat sink 32 is operatively coupled to the heat exchanger 34 via the fluid conduits 36. As used herein with respect to a heat sink 32 and a heat exchanger 34, "operatively coupled" means that the two components are coupled in a manner that allows a heated fluid in the heat sink 32 to move into the heat exchanger 34.

The plurality of electrical components 50 includes at least two components 50, one of which is enclosed within the sealing compound 100. That is, as used herein, there are "enclosed components" and "exposed components." "Enclosed components" are components that are disposed within and substantially sealed within the sealing compound 100. "Exposed components" are components that are not disposed and substantially sealed within the sealing compound 100; "exposed components" may otherwise be generally protected, e.g. by the support assembly 12 or another housing assembly. Further, when an entire component is exposed, it means that substantially all of that component is exposed. Put in other terms, when an entire component is exposed then the sealing compound 100 does not cover all or substantially all of the component(s) 50. Further, as discussed in detail below, less than all of the plurality of electrical components 50 are "enclosed components." That is, a number of the plurality of electrical components 50 are "enclosed components," and, a number of the plurality of electrical components 50 are "exposed components." Accordingly, as used herein, "a limited number of the, or said, electrical components" means at least one, but less than all electrical components 50.

As shown in FIG. 2, the plurality of electrical components 50 includes transistors 52 and diodes 54. Transistor 52 is, in an exemplary embodiment, a generally planar semiconductor power switch 53 and is shown as an Insulated Gate Bipolar Transistor 56 (IGBT). The outer planar surface of the IGBT 56 is coupled to a diode 54. The plurality of electrical components 50 also include, but is not limited to, a power supply 58 and a gate driver 59. It is understood that the IGBT 56 shown is only an exemplary component. The semiconductor power switch 53, such as IGBT 56, includes a generally planar body 60 having a length, width, and thickness. The length and width of the semiconductor power switch 53 are both less than the length and width of the heat sink planar member 38.

The plurality of electrical buses 70 are structured to electrically couple the electrical components 50 to each other and to a capacitor 14. The number of buses may include a plurality of buses, but as shown in an exemplary embodiment, a single elongated bus assembly 72 is used. Bus assembly 72 includes an elongated, generally planar body 74 having an upper, first end, 76, a lower, second end 78, a proximal side 80, and a distal side 82. In an exemplary embodiment, as shown, bus body 74 includes a number of tabs 84. Tabs 84 extend generally normal to the plane of bus body 74 and are disposed at bus body proximal side 80. In an exemplary embodiment, tabs 84 are portions of L-shaped conductive bodies 86 that are coupled or fixed to, and in electrical communication with, bus body 74. It is understood that bus assembly 72 may also be a unitary body (not shown). Tabs 84 are structured to be coupled to, and in electrical communication with, electrical components 50 and a capacitor 14. That is, when arm assembly 16 is assembled, bus assembly 72 is coupled to, and in electrical communication with, IGBT 56, power supply 58, and gate driver 59 as well as a capacitor 14.

The heat exchanger assembly 30, plurality of electrical components 50 (in the exemplary embodiment IGBT 56), and electrical buses 70 are assembled as follows. IGBT 56 is coupled to, or directly coupled to, heat sink planar member 38 with the planes of IGBT 56 and heat sink planar member 38 being generally parallel. That is, a broad, flat side of IGBT planar body 60 is coupled to, or directly coupled to, a broad flat side of heat sink planar member 38. IGBT 56 and heat sink planar member 38 each include a coupling assembly 39. In an exemplary embodiment, coupling assembly 39 is a plurality of nuts and bolts as well as a number of passages 61 through IGBT 56 and heat sink planar member 38. IGBT planar body 60 is disposed adjacent to, or on, heat sink planar member 38 with the coupling assembly 39 extending through the passages 61 in IGBT planar body 60 and sink planar member 38.

Bus assembly 72 is then coupled to IGBT 56, and in an exemplary embodiment with a diode 54 disposed therebetween. A structural brace 90 is used to couple bus assembly 72 to diode 54 without providing a current path between IGBT 56 and bus assembly 72. In an exemplary embodiment, the brace 90 is made of glastic (part glass and part plastic). The structural brace 90 may also be coupled to IGBT planar body 60 by removable coupling assembly 39 extending through passages 61. Bus body 74 is disposed adjacent to, or in direct contact with, IGBT 56 or diode 54. The plane of bus body 74 extends generally perpendicular to the plane of IGBT planar body 60. That is, bus body proximal side 80 is disposed adjacent to, coupled to, or directly coupled to IGBT planar body 60. Thus, the general cross-sectional shape of the assembly of the IGBT planar body 60 and bus body 74 is "T" shaped. The power supply 58 and gate driver 59 are then coupled to bus body 74 at a location spaced from bus body proximal side 80.

Sealing compound 100 is an insulative material. Although any non-conductive insulative material can be used, such as a non-conductive gas, oil, or gel, in an exemplary embodiment, insulative material is a potting compound. The sealing compound 100 can be any known or commonly used non-conductive insulator, but, in an exemplary embodiment, a RTV silicone based compound is used. Also, in an exemplary embodiment, the sealing compound 100 is Elastocil® RT-601, made by Wacker Chemie GmbH or QSIL 214 manufactured by Quantum Silicones. Any other silicone based compound having similar or equivalent characteristics would also be desirable. The use of the sealing compound 100 around the components 50 identified below, prevents all, or almost all, of the air or other harmful gases, that the components 50 would normally be exposed to, from contacting the components 50. This removal of the air or gases prevents them from acting as a conductor, and as such prevents corona-effect and partial discharge from occurring. Accordingly, the components 50 within the sealing compound 100 can be placed very close to each other.

The sealing compound 100 is applied using known processes, over and about the components 50 identified below in such a manner as to substantially penetrate all, or almost all of the air pockets and gaps in and/or around the electrically active devices. The presence of any substantial amount of air or atmosphere would allow occurrence of the adverse effects related to having high voltage devices close to each other to which this invention is directed to greatly reduce or eliminate. Another beneficial aspect of the above sealing compound 100, and its equivalents, is its removability from the components 50 identified below when repairs are needed, since after curing the silicone insulator compound may turn from liquid to a consistency like a gel with varied amount of firmness.

The sealing compound 100 is applied to a limited number of electrical components 50. As used herein, "applied to" means "substantially covering the otherwise exposed surface of." As shown, in an exemplary embodiment, sealing compound 100 is applied to IGBT 56, diode 54, and the electrical buses 70. That is, IGBT 56, diode 54, and the electrical buses 70 are enclosed components. Sealing compound 100 is further applied to structural brace 90. The power supply 58 and gate driver 59 are not covered by sealing compound 100. That is, power supply 58 and gate driver 59 are exposed components. Stated alternatively, the enclosed components do not include the power supply 58 and gate driver 59, or, the power supply 58 and gate driver 59 are disposed outside of the sealing compound 100. Further, sealing compound 100 is applied such that the sealing compound 100 generally has a thickness of less than one inch. As used herein, the "thickness" of the sealing compound 100 is measured generally perpendicular to the surface of the sealing compound 100. It is understood that at selected locations, such as, but not limited to, corners and along lines extending parallel to surfaces of the sealing compound 100, the thickness of the sealing compound 100 may be greater than one inch.

Further, sealing compound 100 is applied such that the heat sink 32 is not enclosed within sealing compound 100. That is, the heat sink 32 has a width and the sealing compound 100 has a width, wherein the width of the sealing compound 100 is measured in a direction parallel to the width of heat sink 32. The width of the sealing compound 100 is less than the width of the heat sink 32. Similarly, the heat sink 32 has a height and the sealing compound 100 has a height, wherein the height of the sealing compound 100 is measured in a direction parallel to the height of heat sink 32. The height of the sealing compound 100 is less than the height of the heat sink 32.

Further, rather than filling in the entire space about the arm assembly 16, the sealing compound 100 is shaped to follow the contour of the electrical bus 70 and the contour of the limited number of enclosed components 50. For example, as noted above, when the electrical bus 70 and the enclosed components 50 are coupled, the assembly of the electrical bus 70 and the enclosed components 50 have a T-shaped cross-section. Thus, the sealing compound 100 also has a T-shaped cross-section. The sealing compound 100 includes a number of fastener passages 62 wherein each sealing compound fastener passage 62 is aligned with a heat sink removable coupling assembly 39.

To describe the above configuration in an alternate manner, of all the elements of the arm assembly 16 identified above, the semiconductor power switch 53, the bus assembly 72 and the brace 90 may be collectively identified as a "half phase leg assembly 98." Further, of the all the elements of the arm assembly 16, only the half phase leg assembly 98 is an enclosed component. That is, any component of the arm assembly 16 other than a component that is part of the half phase leg assembly 98 is an exposed component.

In another embodiment, not shown, the sealing compound 100 is applied to the electrical bus 70 only. That is, while sealing compound 100 may contact portions of the electrical components, only the electrical bus 70 is substantially enclosed in sealing compound 100. Stated alternatively, only the electrical bus 70 is an enclosed component.

Figures 3A, 3B:
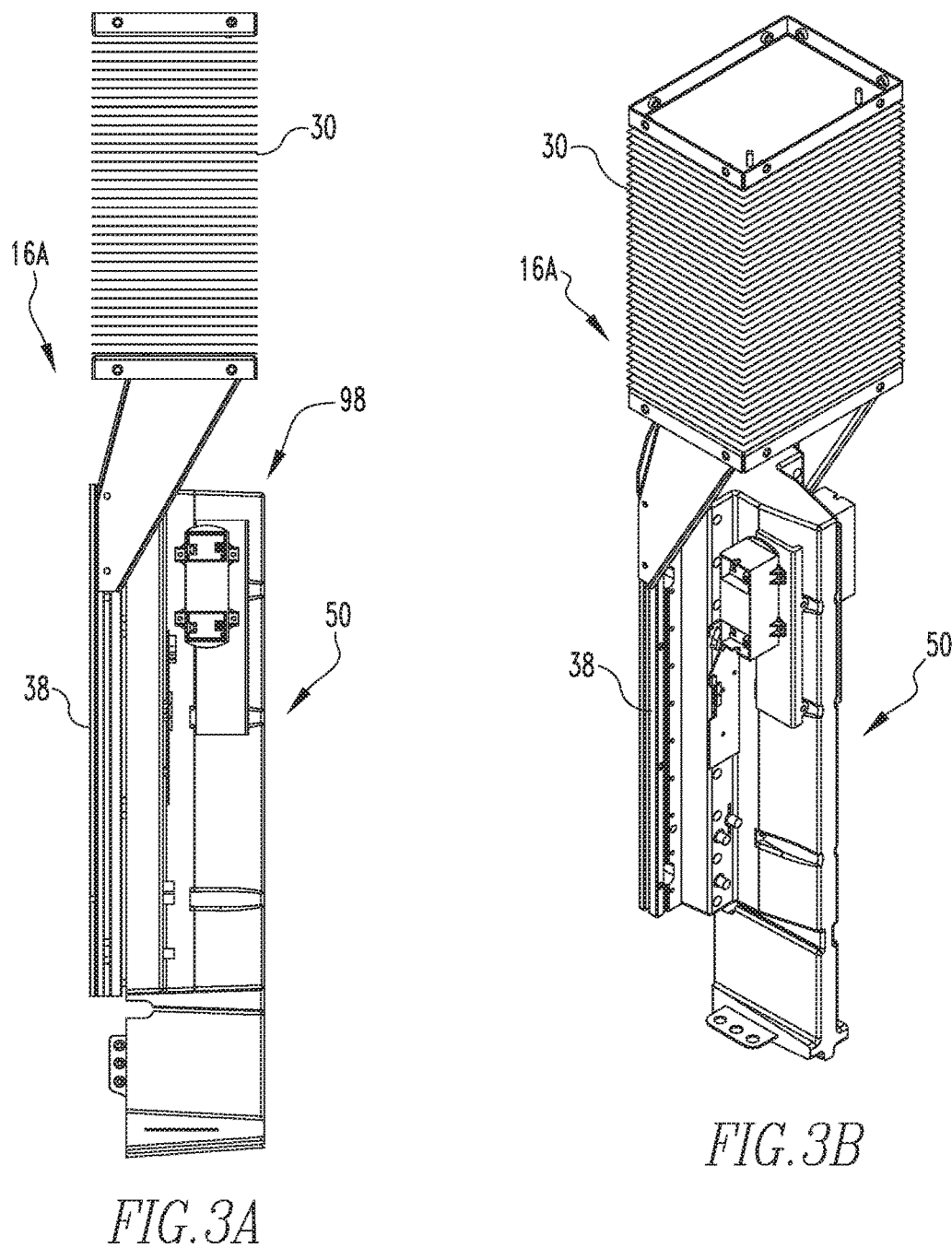
FIG. 3A is a side view of a single pole arm assembly.
FIG. 3B is an isometric view of a single pole arm assembly.
Figures 4A, 4B:
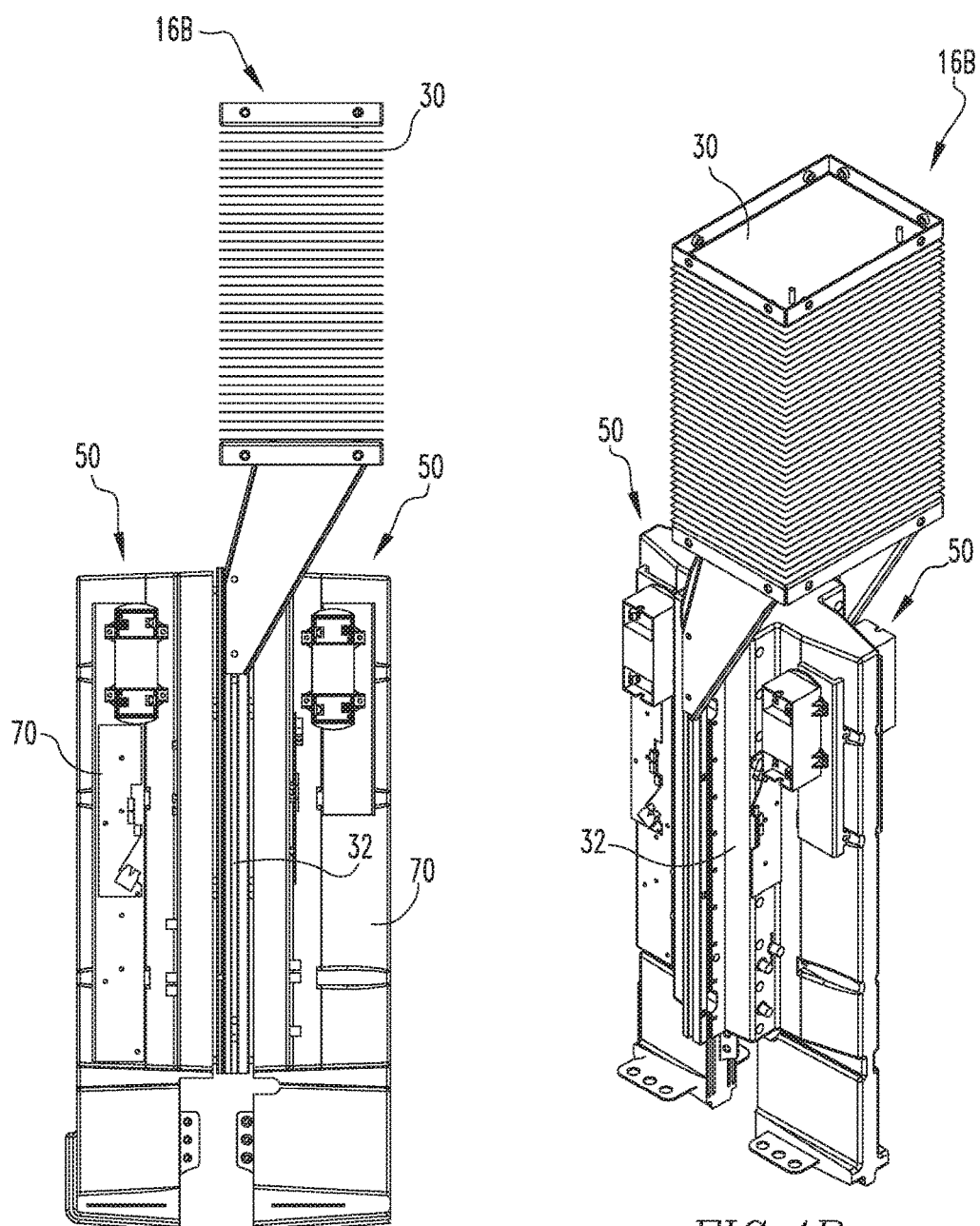
FIG. 4A is a side view of a two-pole arm assembly.
FIG. 4B is an isometric view of a two-pole arm assembly.

The arm assembly 16 is, in one embodiment shown in FIGS. 3A and 3B, a single pole or "half phase arm assembly" 16A. In another embodiment shown in FIGS. 4A and 4B, the arm assembly 16 is a two-pole or "full phase arm assembly" 16B. The single pole arm assembly 16A is described above. That is, there is a heat sink planar member 38 with a number of electrical components 50 coupled to one side of the heat sink planar member 38. In the embodiment wherein the arm assembly 16 is a two-pole arm assembly 16B, there is a single heat exchanger assembly 30, but electrical components 50 and a number of electrical buses 70 are disposed on both sides of the heat sink 32. Other than having the electrical components 50 and a number of electrical buses 70 disposed on both sides of the heat sink 32 the configuration of the components are similar to the configuration described above. This means that there are at least two electrical buses 70, one on each side of the heat sink 32. Thus, in the embodiment wherein the arm assembly 16 is a two-pole arm assembly 16B, the planar bus bodies 74 of the two electrical buses 70 are disposed in a substantially parallel relationship with each other with the heat sink 32 disposed therebetween.

Accordingly, there are also two embodiments of the power pole inverter 10. In one embodiment, shown in FIG. 1, a power pole inverter 10A includes a plurality of single pole arm assemblies 16A. That is, each arm assembly 16 is a single pole arm assembly 16A as described above. In one embodiment, the two single pole arm assemblies 16A are disposed "back to back." That is, the two single pole arm assemblies 16A are disposed with their heat sinks 32, and more specifically the broad planar side of the heat sink planar member 38 without electrical components thereon, are coupled to, or directly coupled to, each other. As shown, the power pole inverter 10A includes six single pole arm assemblies 16A disposed in three back-to-back pairs.

Figure 5:
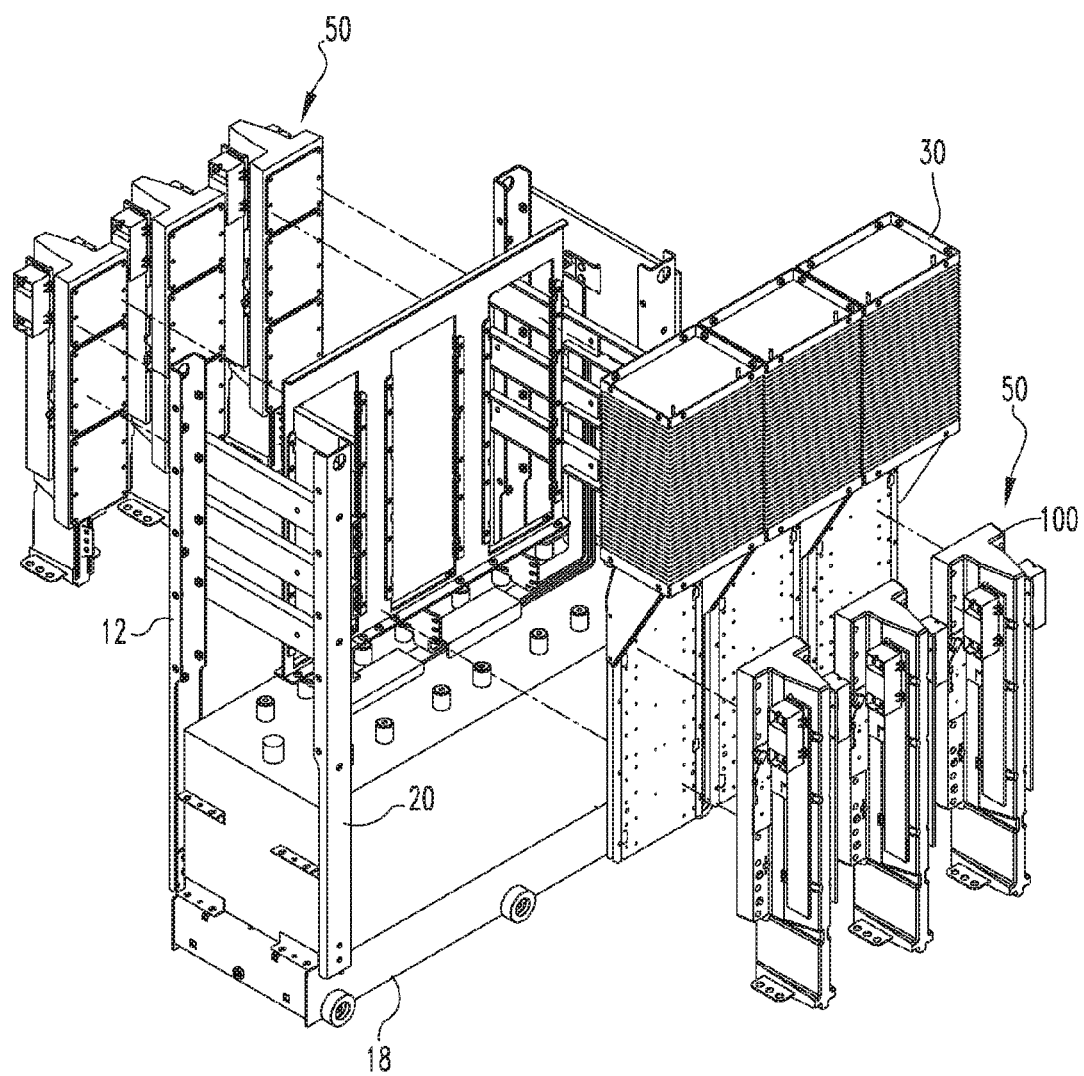
FIG. 5 is an isometric exploded view of an alternate embodiment of the power pole inverter.

As shown in FIG. 5, in another embodiment, power pole inverter 10B includes a number of two-pole arm assemblies 16B. That is, each arm assembly 16 is a two-pole arm assembly 16B as described above. As shown, the power pole inverter 10B includes three two-pole arm assemblies 16B.

While specific embodiments of the disclosed and claimed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed and claimed concept which is to be given the full breadth of the claims appended and any and all equivalents thereof.

What is claimed is:

1. An arm assembly comprising:
   a plurality of electrical components;
   a number of electrical buses;
   each electrical component coupled to, and in electrical communication with, one said electrical bus;
   a sealing compound applied to each said electrical bus and to a limited number of said electrical components;
   wherein said limited number of said electrical components having said sealing compound applied thereto are enclosed components and any component without said sealing compound applied thereto is an exposed component; and
   wherein said enclosed components are substantially sealed from an atmosphere.

2. The arm assembly of claim 1 wherein said sealing compound generally has a thickness of less than one inch.

3. The arm assembly of claim 1 wherein said sealing compound is shaped to follow the contour of said electrical bus and the contour of said limited number of enclosed components.

4. The arm assembly of claim 1 wherein:
   said plurality of electrical components includes a generally planar semiconductor power switch;
   said number of electrical buses includes a generally planar bus body;
   said bus body coupled to said semiconductor power switch with the planes of the bus body and the semiconductor power switch being generally perpendicular; and
   said sealing compound having a generally T-shaped cross-section.

5. The arm assembly of claim 1 wherein:
   said plurality of electrical components includes a generally planar semiconductor power switch, a power supply and a gate driver; and
   said enclosed components does not include said power supply and said gate driver.

6. The arm assembly of claim 1 wherein:
   said plurality of electrical components includes a generally planar semiconductor power switch;
   said number of electrical buses includes a generally planar bus body;
   said bus body coupled to said semiconductor power switch with the planes of the bus body and the semiconductor power switch being generally perpendicular;
   said sealing compound having a generally T-shaped cross-section; and said semiconductor power switch and said bus body disposed within said sealing compound.

7. The arm assembly of claim 6 wherein said semiconductor power switch is an Insulated Gate Bipolar Transistor.

8. A power pole inverter comprising:
a number of capacitors;
a number of arm assemblies, each arm assembly coupled to, and in electrical communication with, one capacitor;
each arm assembly including a plurality of electrical components, a number of electrical buses, and a sealing compound;
wherein, within each arm assembly:
said sealing compound is applied to each said electrical bus and to a limited number of said electrical components;
wherein said limited number of said electrical components having said sealing compound applied thereto are enclosed components; and
wherein said enclosed components are substantially sealed from an atmosphere.

9. The power pole inverter of claim 8 wherein, within each arm assembly, said sealing compound generally has a thickness of less than one inch.

10. The power pole inverter of claim 8 wherein, within each arm assembly, said sealing compound is shaped to follow the contour of said electrical bus and the contour of the limited number of enclosed components.

11. The power pole inverter of claim 8 wherein within each arm assembly:
said plurality of electrical components includes a generally planar semiconductor power switch;
said number of electrical buses includes a generally planar bus body;
said bus body coupled to said semiconductor power switch with the planes of the bus body and the semiconductor power switch being generally perpendicular; and
said sealing compound having a generally T-shaped cross-section.

12. The power pole inverter of claim 8 wherein within each arm assembly:
said plurality of electrical components includes a generally planar semiconductor power switch, a power supply and a gate driver; and
said limited number of said electrical components does not include said power supply and said gate driver.

13. The power pole inverter of claim 8 wherein within each arm assembly:
said plurality of electrical components includes a generally planar semiconductor power switch;
said number of electrical buses includes a generally planar bus body;
said bus body coupled to said semiconductor power switch with the planes of the bus body and the semiconductor power switch being generally perpendicular;
said sealing compound having a generally T-shaped cross-section; and
said semiconductor power switch and said bus body disposed within said sealing compound.

14. The power pole inverter of claim 13 wherein each said semiconductor power switch is an Insulated Gate Bipolar Transistor.

15. A power pole inverter comprising:
a number of capacitors;
a number of arm assemblies, each arm assembly coupled to, and in electrical communication with, one capacitor;
each arm assembly including a plurality of electrical components, a number of electrical buses, and a sealing compound;
wherein, within each arm assembly:
said electrical components include a semiconductor power switch;
said semiconductor power switch and said electrical buses form a half phase leg assembly;
said sealing compound is applied only to each said half phase leg assembly; and
wherein said enclosed half phase leg assembly is substantially sealed from an atmosphere.

* * * * *